United States Patent
deVilliers et al.

(10) Patent No.: US 11,342,427 B2
(45) Date of Patent: May 24, 2022

(54) 3D DIRECTED SELF-ASSEMBLY FOR NANOSTRUCTURES

(71) Applicant: Tokyo Electron Limited, Tokyo (JP)

(72) Inventors: Anton deVilliers, Clifton Park, NY (US); Jodi Grzeskowiak, Cuddebackville, NY (US); Lars Liebmann, Mechanicsville, NY (US); Daniel Chanemougame, Niskayuna, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 90 days.

(21) Appl. No.: 17/060,982

(22) Filed: Oct. 1, 2020

(65) Prior Publication Data
US 2021/0104609 A1   Apr. 8, 2021

Related U.S. Application Data

(60) Provisional application No. 62/909,448, filed on Oct. 2, 2019.

(51) Int. Cl.
*H01L 29/41* (2006.01)
*H01L 29/417* (2006.01)
(Continued)

(52) U.S. Cl.
CPC ...... *H01L 29/413* (2013.01); *H01L 21/76816* (2013.01); *H01L 21/76828* (2013.01);
(Continued)

(58) Field of Classification Search
CPC ......... H01L 21/02118; H01L 21/02282; H01L 21/02318; H01L 21/768; H01L 21/76816; H01L 21/76822; H01L 21/76823; H01L 21/76828; H01L 21/76837; H01L 29/0665; H01L 29/0669; H01L 29/0673;
(Continued)

(56) References Cited

U.S. PATENT DOCUMENTS

2019/0039355 A1* 2/2019 Oh .................... G06F 1/1652

OTHER PUBLICATIONS

Hannon, A. F., et al., "Simulation methods for solvent vapor annealing of block copolymer thin films", Royal Society of Chemistry, Soft Matter, 11, www.rsc.org/softmatter, Mar. 27, 2015, 12 pages.

(Continued)

*Primary Examiner* — Cheung Lee
(74) *Attorney, Agent, or Firm* — Slater Matsil, LLP

(57) ABSTRACT

A method for forming a device includes receiving a substrate having nano-channels positioned over the substrate. A gate is formed all around a cross-section of the nano-channels, and the nano-channels extend in a direction parallel to a working surface of the substrate in a manner such that first nano-channels are positioned vertically above second nano-channels in a vertical stack. The method includes depositing a polymer mixture on the substrate that fills the open spaces around the nano-channels, causing self-assembly of the polymer mixture resulting in forming polymer cylinders extending parallel to the working surface of the substrate and perpendicular to the nano-channels, and metalizing the polymer cylinders sufficient to create an electrical connection to terminals of the nano-channels.

20 Claims, 9 Drawing Sheets

(51) Int. Cl.
*H01L 29/40* (2006.01)
*H01L 21/768* (2006.01)
*H01L 27/12* (2006.01)
*H01L 29/66* (2006.01)
*H01L 21/02* (2006.01)
*H01L 29/06* (2006.01)
*H01L 29/786* (2006.01)
*H01L 29/423* (2006.01)

(52) U.S. Cl.
CPC ........ *H01L 27/1292* (2013.01); *H01L 29/401* (2013.01); *H01L 29/41733* (2013.01); *H01L 29/66742* (2013.01); *H01L 21/02118* (2013.01); *H01L 21/02282* (2013.01); *H01L 29/0665* (2013.01); *H01L 29/42392* (2013.01); *H01L 29/78696* (2013.01)

(58) Field of Classification Search
CPC ................. H01L 29/401; H01L 29/413; H01L 29/41733; H01L 29/66439; H01L 29/66742; H01L 29/786; H01L 29/78642; H01L 29/78696; H01L 29/42392; B82Y 10/00; B82Y 30/00; B82Y 40/00
See application file for complete search history.

(56) References Cited

OTHER PUBLICATIONS

Tavakkoli K.G., A. et al., "Multilayer block copolymer meshes by orthogonal self-assembly", Nature Communications, DOI: 10.1038/ncomms, 10518, Jan. 22, 2016, 10 pages.

Tavakkoli K.G., A., et al., "Templating Three-Dimensional Self-Assembled Structures in Bilayer Block Copolymer Films", Science, vol. 336, www.sciencemag.org, Jun. 8, 2012, 6 pages.

Waldman, Ruben Z., et al., "The chemical physics of sequential infiltration synthesis—A thermodynamic and kinetic perspective", The Journal of Chemical Physics, 151, 190901, Nov. 19, 2019, 26 pages.

* cited by examiner

3D DIRECTED SELF-ASSEMBLY FOR NANOSTRUCTURES

CROSS-REFERENCE TO RELATED APPLICATIONS

This application claims the benefit of U.S. Provisional Application No. 62/909,448, filed on Oct. 2, 2019 which application is hereby incorporated herein by reference.

TECHNICAL FIELD

The present invention relates generally to semiconductor processing, and in particular embodiments, to methods for 3D directed self-assembly for nanostructures.

BACKGROUND

Generally the fabrication of integrated circuits (IC) requires the formation of numerous device elements onto a semiconductor substrate. In the manufacture of IC's, various fabrication processes are executed such as film-forming depositions, etch mask creation, patterning, material etching and removal, and doping treatments. These processes are performed repeatedly to form structures for circuit components and interconnect elements (e.g. transistors, resistors, capacitors, metal lines, contacts, and vias). Historically, with microfabrication, transistors have been created in one plane, with wiring/metallization formed above the active device plane, and have thus been characterized as two-dimensional (2D) circuits or 2D fabrication.

At each successive technology node, the sizes of IC device elements are shrunk to roughly double the component packing density. These scaling efforts have greatly increased the number of circuit elements and interconnect elements per unit area of a 2D circuit. As these scaling efforts are entering single digit nanometer technology nodes, it is becoming increasingly more challenging to achieve the required packing density using 2D fabrication.

Three-dimensional (3D) circuits or 3D fabrication has been identified as an alternative method to form more densely packed devices. 3D integration overcomes scaling limitations of 2D circuits by increasing device elements density in volume rather than area by vertically stacking multiple devices. However, 3D circuits have their own advantages and disadvantages. While 3D circuits have been successfully demonstrated with 3D NAND, 3D integration of logic devices brings a unique set of challenges.

SUMMARY

In accordance with an embodiment of the present invention, a method for forming a device includes receiving a substrate having nano-channels positioned over the substrate and extending in a direction parallel to a working surface of the substrate, the nano-channels arranged so that first nano-channels are positioned vertically above second nano-channels in a vertical stack, the nano-channels having a gate formed all around a cross section of the nano-channels; depositing a polymer mixture on the substrate that fills open spaces around the nano-channels; causing self-assembly of the polymer mixture resulting in forming polymer cylinders extending parallel to the working surface of the substrate and perpendicular to the nano-channels; and metalizing the polymer cylinders sufficient to create an electrical connection to terminals of the nano-channels.

In accordance with an embodiment of the present invention, a method for forming a device includes receiving a substrate having a three dimensional (3D) structure including a plurality of nano-sheets, a plurality of walls, and a plurality of cavities, one of the plurality of nano-sheets including a first sheet separated from a second sheet of the plurality of nano-sheets in a first direction by one of the plurality of cavities, the plurality of nano-sheets being supported by the plurality of walls, the plurality of nano-sheets extending along a second direction orthogonal to the first direction, the first sheet being spaced apart from a third sheet of the plurality of nano-sheets along a horizontal plane in a third direction that is orthogonal to both the first and the second directions; and forming a plurality of cylindrical interconnects within the 3D structure with a directed self assembly process, where each of the plurality of cavities includes one of the plurality of cylindrical interconnects.

In accordance with an embodiment of the present invention, a method for forming a device includes forming a first stack of plurality of nano-lines over a substrate, the first stack of plurality of nano-lines including first nano-lines arranged in a first plane above the substrate and second nano-lines arranged in a second plane above the first plane; and forming a first set of polymer cylinders between the first nano-lines and the second nano-lines with a first directed self-assembly process.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1F illustrate cross-sectional views of a semiconductor device during various stages of fabrication in accordance with an embodiment of the present application, wherein FIG. 1A illustrates a cross-sectional view of a 3D device, FIG. 1B illustrates a top view of the 3D device illustrated in FIG. 1A, FIG. 1C illustrates a cross-sectional view of the 3D device after coating with a self-assembling polymer mixture, FIG. 1D illustrates a cross-sectional view of the 3D device after causing self-assembly of the polymer mixture in order to form a pattern of interconnects, FIG. 1E illustrates a cross-sectional view of the 3D device after an optional step of selectively etching the pattern of interconnects, and FIG. 1F illustrates a cross-sectional view of the 3D device after metalizing the pattern of interconnects to form functional interconnects;

FIGS. 3A-3B illustrate cross-sectional views of a semiconductor device during various stages of fabrication in accordance with an embodiment of the present application, wherein FIG. 3A illustrates a cross-sectional view of the device after forming a first nano-sheet with a respective first set of interconnects, and FIG. 3B illustrates a cross-sectional view of the device after forming a second nano-sheet and a respective second set of interconnects;

FIG. 4A illustrates a cross-sectional view of the device after forming a second stack of nano-sheets over the first stack of nano-sheets, FIG. 4B illustrates a cross-sectional view of the device after coating the device with a second self-assembling polymer mixture, FIG. 4C illustrates a cross-sectional view of the device after causing self-assembly of the second polymer mixture in order to form a second pattern for interconnects, and FIG. 4D illustrates a cross-sectional view of the device after metalizing the second pattern of interconnects to form functional interconnects;

FIG. 6 illustrates a cross-sectional view of a semiconductor device during a stage of fabrication in accordance with an embodiment of the present application, wherein FIG. 6 illustrates a cross-sectional view of the device after orthogonal interconnects are formed over stacks of nano-sheets; and FIGS. 7A-7B illustrates cross-sectional views of a semiconductor device during a stage of fabrication in accordance with an embodiment of the present application, wherein FIG. 7A illustrates a top view of the device after interconnects are routed between different vertical stacks of nano-sheets or nano-wires across the working surface of the substrate, and FIG. 7B illustrates a cross-sectional view of an upward angled interconnect.

DETAILED DESCRIPTION OF ILLUSTRATIVE EMBODIMENTS

As previously mentioned, a vertical stack design of 3D integrated devices offers an increase in packing density. However, 3D integration has a number of engineering difficulties arising from the verticality of 3D device structures. This disclosure describes embodiments of methods to mitigate some of those issues.

3D integration overcomes scaling limitations of 2D circuits by increasing device elements density in volume rather than area by vertically stacking multiple devices. One disadvantage of vertically stacking device elements is that it creates obstacles because the terminals of device elements are not accessible from the top surface of the device. This is especially problematic when forming interconnects between device elements. One issue when forming interconnects is that conventional interconnect development processes are top-down processes. For example, interconnect structures such as holes for contacts or vias are formed by vertical etching, as understood by those with ordinary skill in the art. This is acceptable for forming interconnections of a 2D device because the terminals of each device element are accessible from above the substrate. In the case of a 3D device, device elements are stacked vertically and the terminals of every device element are not accessible from the top of the device and interconnects may have to be routed horizontally between device elements in vertical layers. Therefore, an interconnect development process that can form horizontal interconnections between vertical layers can ease the difficulties of interconnecting 3D structures.

Another issue with 3D integration is the metallization of interconnects. Typically interconnect features, such as holes for contacts or vias, are metalized by depositing metal into the etched holes using a conventional top-down method. In the case of 3D integration, as discussed above, the interconnect structures are routed vertically and cannot be metalized using a conventional top down metallization process.

Embodiments of the present invention advantageously overcome the above issues by forming interconnections using directed-self assembly which allows for the formation of horizontally routed interconnects between vertically stacked device elements. Accordingly, one or more embodiments will be described using the cross-sectional FIGS. 1A-1F along with the flow chart of FIG. 2. Further embodiments of forming interconnects using a directed-self assembly will be described using FIGS. 3-7.

FIGS. 1A-1F illustrate cross-sectional views of a semiconductor device during various stages of fabrication in accordance with an embodiment of the present application.

Figure 1A:
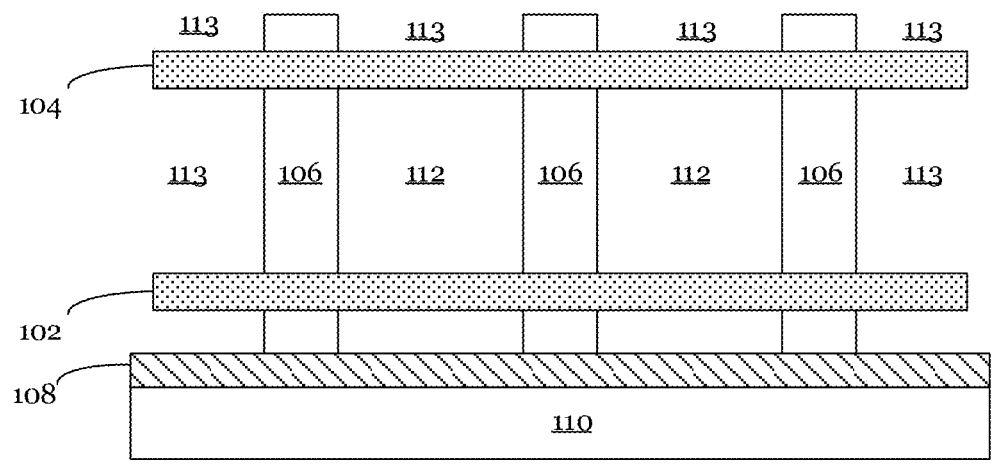
Figure 1B:
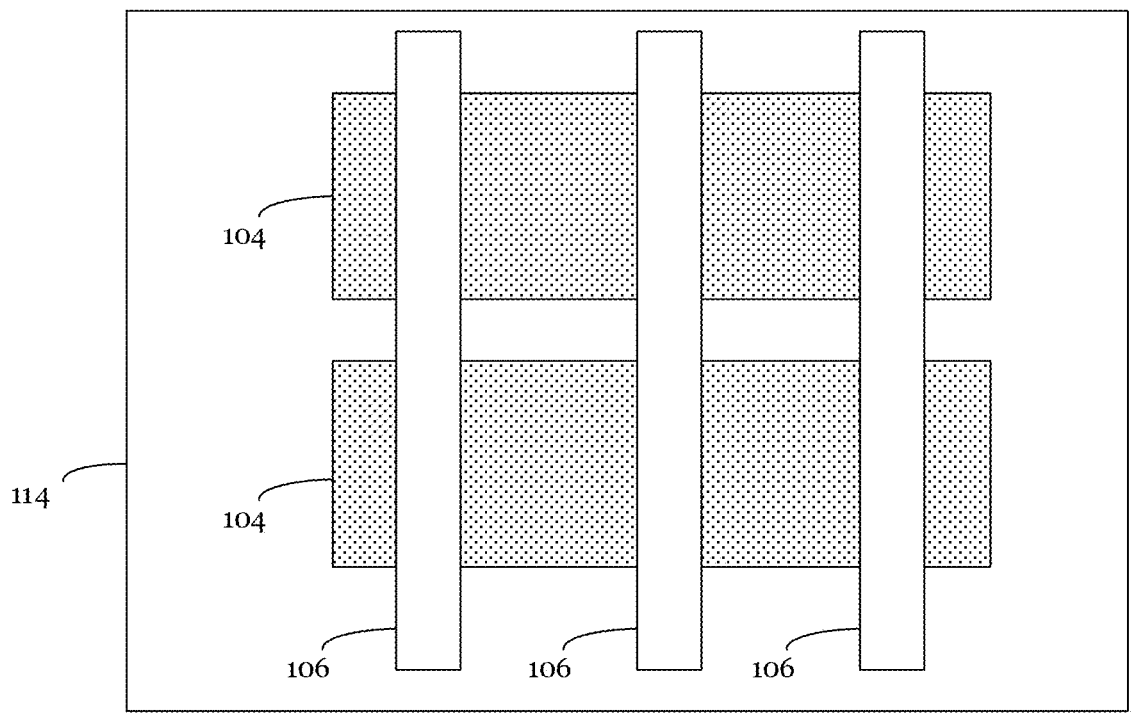

FIG. 1A illustrates a cross-sectional view of an example 3D integrated device and FIG. 1B illustrates a top view of the 3D device illustrated in FIG. 1A. In this illustrative embodiment, the 3D integrated device is a gate-all-around transistor. The 3D integrated device may include vertically stacked structures comprising nano-sheets or nano-wires that may be used to form logic devices such as a complementary metal oxide semiconductor (CMOS) device, memory devices such as a NAND or NOR memory.

In one illustrated embodiment, the nano-sheets (nano-wires or nano-channels when the width of the sheets is in the nanometer regime) comprise a second nano-sheet 104 vertically stacked over a first nano-sheet 102 formed over an insulating layer 108 formed over a substrate 110. The insulating layer 108 may comprise an insulating oxide material such as silicon oxide or silicon dioxide and may further include other dielectric materials such as silicon nitride. The substrate no may be a bulk substrate such as a bulk silicon substrate, a silicon on insulator substrate, or various other semiconductor substrates including a germanium substrate, a silicon carbide substrate, a gallium nitride substrate, a gallium arsenide substrate, and others.

In various embodiments, the first nano-sheet 102 may comprise a plurality of a first type of transistors and the second nano-sheet 104 may comprise a plurality of second type of transistors. In one or more embodiments, the first type of transistors may be a gate all around field effect transistor, a non-volatile memory such as a NAND or NOR memory, transistor or capacitors used in a volatile memory such as SRAM, DRAM, and others. Similarly, in one or more embodiments, the second type of transistors may be a gate all around field effect transistor, a non-volatile memory such as a NAND or NOR memory, transistor or capacitors used in a volatile memory such as SRAM, DRAM, and others.

In one example, the first nano-sheet 102 may comprise a plurality of n-type MOS devices and the second nano-sheet 104 may comprise a plurality of p-type MOS devices. In another example, the first nano-sheet 102 may comprise a plurality of p-type MOS devices and the second nano-sheet 104 may comprise a plurality of n-type MOS devices. The first nano-sheet 102 and the second nano-sheet 104 are positioned over the substrate in a manner such that the first nano-sheet 102 and the second nano-sheet 104 extend in a direction parallel to a working surface of the substrate. In various embodiments, the first nano-sheet 102 may be vertically stacked above the second nano-sheet 104.

The first nano-sheet 102 and the second nano-sheet 104 may extend in a horizontal direction and are supported by gates 106 physically wrapped around the first nano-sheet 102 and the second nano-sheet 104. The gates 106 may comprise polysilicon, titanium nitride, and/or other metallic materials known to a person having ordinary skill in the art.

The first nano-sheet 102 and the second nano-sheet 104 extend between the gates 106, forming a plurality of cavities 112 in the form of trenches bookended by adjacent pairs of gates 106, and nano-channels at each intersection between the nano-sheets and the gates 106. Also, a set of outer spaces 113 are formed where the first nano-sheet 102 and the second nano-sheet 104 extend past the outer gates 106 and where the gates 106 extend above the second nano-sheet 104. The first nano-sheet 102 and the second nano-sheet 104 are separated vertically by the plurality of cavities 112. The plurality of cavities 112 extend in a direction orthogonal to the first nano-sheet 102 and the second nano-sheet 104 and oriented parallel to the gates 106.

As understood by those with ordinary skill in the art, the first nano-sheet 102 and the second nano-sheet 104, or nano-wires in other embodiments, may be formed by forming an alternating series of active and sacrificial layers, patterning the alternating layers into individual nano-sheets or nano-wires corresponding to different field-effect transistors (FET), and then removing the sacrificial layers selective to the active layers after patterning. The active and sacrificial layers may comprise of two different layers that can be selectively etched to one another as alternating layers. For example the active layers may be selected to be a material selected from groups III-V of the periodic table and the sacrificial layer may be selected to be a material from groups II-VI of the periodic table.

The nanoscale transistor channels formed by the intersection of nano-sheets (nano-wires or nano-lines) with the gates 106 may have various cross-sectional shapes such as circular, rectangular, or square, and may have rounded edges. The first and the second nano-sheets 102 and 104 may be isolated from the gates 106 by a gate dielectric such as silicon oxide, silicon oxynitride, hafnium based oxide, or others and may comprise of any material and may be formed in any manner known by those with ordinary skill in the art. In one embodiment, the gates 106 wrapped around the first nano-sheet 102 and the second nano-sheet 104 have outer side walls having discrete sides. In other embodiments, the gates 106 wrapped around the nano-sheets may have circular outer side walls. The inner walls of the gates 106 contacting the gate dielectric may be formed in any suitable shape, for example, rectangular, circular or substantially circular.

Although FIG. 1A illustrates a single vertically stacked structure of two complimentary nano-sheets, multiple nano-sheets may be stacked to form a 3D integrated device.

FIG. 1B illustrates a top down view of the 3D integrated device. As illustrated in FIG. 1B, multiple vertically stacked structures may be formed adjacent to each other. As illustrated in FIG. 1B, additional vertically stacked structures comprising a second nano-sheet 104 formed over a first nano-sheet 102 may be formed adjacent to each other across a horizontal plane formed by the working surface of the substrate 114. For example, each horizontal plane may include a plurality of nano-sheets such as a plurality of first nano-sheets 102 in a first plane and a plurality of second nano-sheet 104 in a second plane above the first plane.

As illustrated in FIGS. 1A-1B, the plurality of cavities 112 extend in a direction orthogonal (e.g., into the plane of paper in FIG. 1A) to the first nano-sheet 102 and the second nano-sheet 104. Also, the plurality of cavities 112 is not accessible from above the device because they are blocked by the second nano-sheet 104. Therefore, forming horizontal interconnects with a conventional top-down interconnect development processes is difficult because of the lack of access from above the substrate.

Advantageously, as illustrated in FIGS. 1C-1F, a directed-self assembly (DSA) method is used to form horizontally routed interconnects between vertically stacked structures.

Figure 1C:
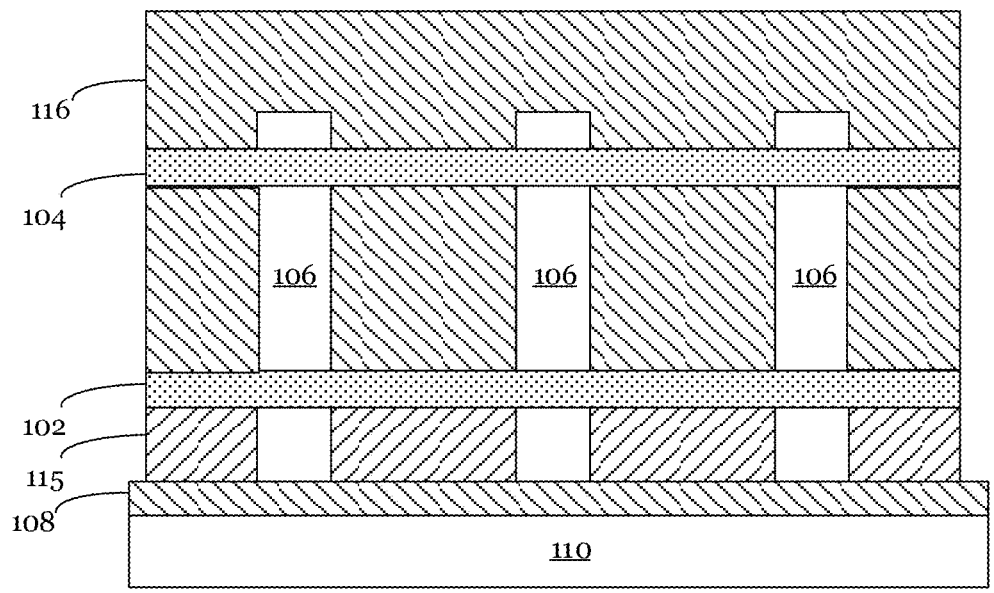

Referring to FIG. 1C, a polymer mixture 116 is coated over the substrate and fills the plurality of cavities 112 between the first nano-sheet 102 and the second nano-sheet 104 and the gates 106, the plurality of outer spaces 113, and the entire working surface of the substrate 114. However, prior to coating the polymer mixture 116, a fill material 115 is coated to fill the cavity between the first nano-sheet 102 and the insulating layer 108. The fill material 115 may be the matrix material (i.e., first polymer of the polymer mixture 116) or other materials such as a resist material, amorphous carbon containing layer, and others. Alternately, in one the fill material 115 is the same material as the polymer mixture 116 and is applied in the same process step. In such an embodiment, the distance between the first nano-sheet 102 and the underlying insulating layer 108 is such that no interconnect cylindrical structures are formed between them.

In various embodiments, the polymer mixture 116 comprises a block copolymer comprising blocks of multiple monomers. As an illustration, the block copolymer may comprise a block of a first monomer (-A-A- . . . A-A-) and a block of a second monomer (-B-B- . . . B-B-). Accordingly, the first polymer may be formed from the first monomer (A) while the second polymer may be formed from the second monomer (B). In one or more embodiments, the polymer mixture 116 is a block copolymer ((-A-A-A-B-B-B-B-)-(-A-A-A-B-B-B-B-)- . . . (-A-A-A-B-B-B-B-)-). In further embodiments, the polymer mixture 116 may also another block copolymer with a different ratio of the first and the second monomers. Examples of polymers precursors used to form the block copolymer include methyl-methacrylate, styrene, dimethylsiloxane, ethylene oxide, butadiene, vinylpyridine, isoprene, latic acid, and others.

In various embodiments, the first monomer has a first mole fraction in the polymer mixture 116 and the second monomer has a second mole fraction in the polymer mixture 116. As is known to a person having ordinary skill in the art, the chemical composition of the block copolymer may be tailored by varying the composition and mole fraction of the monomers to control the type of phase separation after an annealing process. During annealing, the blocks of monomers in the block copolymer undergo microphase separation to form a microstructure containing small polymer units of the first monomer and small polymer units of the second monomer. These units of the first monomer (or first homopolymer) may be separated from the units of the second monomer (second homopolymer) in repeating patterns or periodic structures. The type of pattern may be spheres of the first homopolymer embedded in a matrix of the second homopolymer (or vice versa), hexagonal close packed cylinders of the first homopolymer embedded in a matrix of the second homopolymer (or vice versa), gyroid, or lamellae of alternating first homopolymer and second homopolymer.

As understood by those with ordinary skill in the art, the chemical composition and/or the molecular weight of the polymer mixture 116 may be tuned or formulated based on required device structure geometry including the critical dimension, pitch, microphase separation, volume fraction, the interaction parameter, and the degree of polymerization of the polymer mixture. In various embodiments, the composition of the polymer mixture 116 is controlled so that the subsequent phase separation forms hexagonal close packed cylinders of the first homopolymer embedded in a matrix of the second homopolymer (or vice versa).

In one embodiment, the polymer mixture 116 may be intended to form a cylindrical structure and may comprise a polystyrene-b-polydimethylsiloxane (PS-b-PDMS) block copolymer, polystyrene-b-polymethyl methacrylate (PS-b-PMMA) block copolymer, or a polystyrene-b-2-polyvinylpyridine (PS-P2VP) block copolymer. In various embodiments, the polymer mixture 116 may be deposited using any conventional means known by those with ordinary skill in the art, such as spin-coating with a Track tool.

In one embodiment, the polymer mixture 116 is a bilayer di-block copolymer mixture formed by a mixture of block copolymers each comprising the same two polymers. In other embodiments, the polymer mixture 116 may comprise a multi-block copolymer mixture such as a tri-block terpolymer mixture ((-A-A-A-B-B-B-B-C-C-)-(-A-A-A-B-B-B-B-C-C-)- . . . (-A-A-A-B-B-B-B-C-C-)-) formed by mixing block copolymer mixtures comprising three polymers.

In various embodiments, the polymer mixture 116 may also include a solvent in addition to the block copolymers. The solvent may be selected to be neutral or selected such that the minority polymers of the polymer mixture 116 are highly soluble in the solvent in a subsequent solvent annealing step to cause self-alignment of the polymers comprising the polymer mixture 116. Examples of solvents may include acetone, carbon disulfide, dimethylformamide, toluene, and tetrahydrofuran.

In one embodiment, the polymer mixture 116 comprises a bilayer di-block copolymer configured to form a first set of cylinders where each cylinder of the first set of cylinders comprises the first polymer of the polymer mixture 116 surrounded by a matrix 118 comprising the second polymer of the polymer mixture 116 after microphase separation in a subsequent step. Therefore, in one embodiment, the second polymer (matrix material) is the majority polymer in the polymer mixture 116 and the first polymer used to form the first set of cylinders is the minority polymer in the polymer mixture 116, as understood by those with ordinary skill in the art.

In other embodiments, a tri-block terpolymer, such as polyisoprene-b-polystyrene-b-polylactide, may be configured to form a first set of cylinders comprising a first minority polymer and a second set of cylinders comprising a second minority polymer that are both surrounded by a matrix material comprising a majority third polymer (or any combination thereof). In some embodiments, the first set of cylinders may be dummy interconnects that intersect and terminate with respective nano-sheets and assist in the formation of the second set of cylinders (or vice-versa). In other embodiments, the tri-block terpolymer may be configured to form core-shell cylinders (i.e. a cylinder comprising the first polymer formed inside a cylinder comprising the second polymer in a matrix of the third polymer or any combination thereof) in order to form thinner cylinders than a bilayer di-block copolymer mixture.

Generally, in order to control the location and orientation of the microphase separation of self-aligning structures in a subsequent step, guide patterns such as pinning structures are required. Advantageously, in various embodiment, the plurality of cavities 112 comprise the nano-sheets extending horizontally to the substrate and are bookended by the gates 106, forming nano-channels at the intersection of the nano-sheets and the gates 106 that may be used as pinning structures. Advantageously, this allows for the formation of cylinders within the plurality of cavities 112 to function as interconnects without access to the plurality of cavities 112 from above the substrate. Another advantage of the nano-sheets and the gates 106 functioning as pinning structures is that additional lithography process steps for forming pinning structures or any other guide templates can be avoided, reducing the process time and cost.

In various embodiments, the nano-sheets may be functionalized allowing for the formation of a rich variety of three-dimensional cylinder structures with controllable bends, angles, and junctions based on the periodicity of the nano-sheets. Advantageously, in various embodiments where the first nano-sheet 102 and the second nano-sheet 104 comprise complimentary transistors, the first nano-sheet 102 and the second nano-sheet 104 are already functionalized because the transistors formed in the first nano-sheet 102 and the second nano-sheet 104 are oppositely doped. For example, if the first nano-sheet 102 comprises nmos transistors and the second nano-sheet 104 comprises pmos transistors, the n-doping of the first nano-sheet 102 may attract the minority polymer of the polymer mixture 116 while the opposite doped second nano-sheet 104 repels the minority polymer (or vice versa) due to e.g., surface energy effects. One advantage of this is that the polymer material intended to form the cylinders may be attracted to one of the nano-sheets and self-align to one of the terminals of a transistor of a nano-sheet in a first level and connect to a terminal of a transistor of a nano-sheet in a vertically adjacent level. For example, a cylinder intended to function as an interconnect may self-align to a terminal of a first transistor of the second nano-sheet 104, extend horizontally to adjacent transistors, and self-align to terminals of the same type of transistors of the second nano-sheets 104 of adjacent transistors, and form the structure for interconnects between adjacent transistors based on the periodicity of the nano-channels.

In various embodiments, the nano-sheets may be functionalized using other techniques besides doping such as by using a different material, for example, silicon germanium versus silicon. For example, the pmos transistors may have silicon germanium that may be used to preferentially attract the minority polymer during microphase segregation. Other ways to selectively functionalize may be to use a masking process to selectively cover some of the nano-sheets with a surface material, for example, using a self assembly process or a deposition process. The combination of functionalized nano-sheets with the directed self assembly technique allows the formation of an interconnect pattern that is much more complex. For example, if alternating nano-sheets in a same horizontal plane are functionalized differently, for example, alternating n-type and p-type regions, the cylinders thus being formed may be made to selectively contact only the n-type nano-sheets skipping through the intermediate p-type nano-sheets. For example, a cylinder aligned to a terminal of a transistor of the second nano-sheet 104 may be routed to connect to a terminal in a transistor of a first nano-sheet 102 that is not directionally adjacent across the horizontal plane of the working surface of the substrate 114.

Figure 1D:
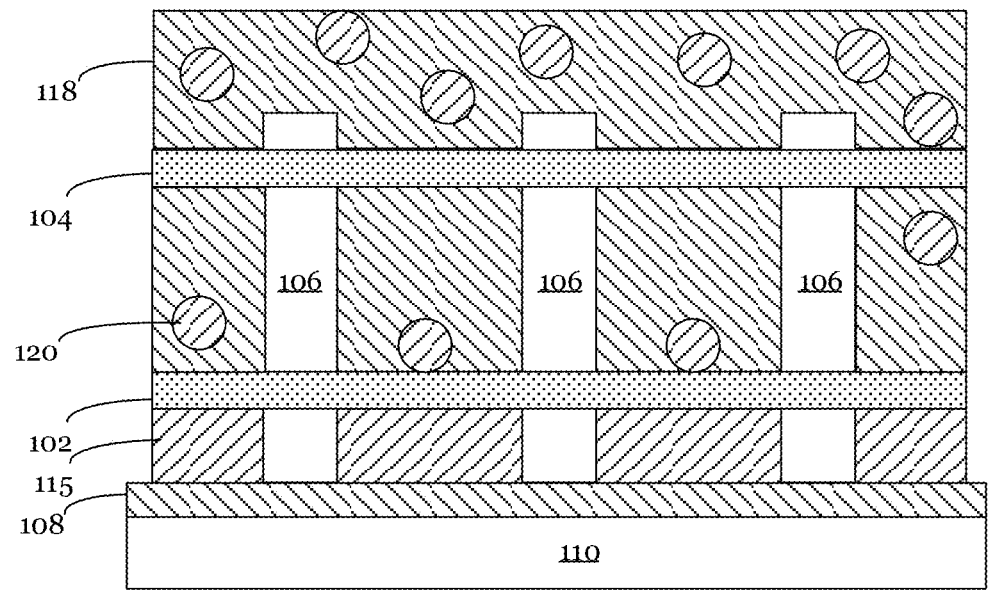

Referring to FIG. 1D, the polymer mixture 116 undergoes microphase separation to form a self-assembling structure. For example, in one embodiment, microphase separation may be caused by thermal annealing which causes the polymers that comprise the polymer mixture 116 to separate and form a structure that may comprise repeating patterns or periodic structures.

Thermal annealing may include hot plate annealing, furnace annealing, flash lamp based annealing, rapid thermal annealing, microwave annealing, or any other annealing method known by one with ordinary skill in the art. In various embodiments, the annealing may be performed between 50° C. to 500° C., and in one embodiment between 200° C. and 400° C.

In other embodiments, solvent vapor annealing may be used to cause microphase separation. Solvent vapor annealing first involves placing the substrate, after it is coated with the polymer mixture 116, in a chamber with a solvent atmosphere. The solvents used to form the atmosphere may be neutral or selective to one of the polymers of the polymer mixture 116. During solvent vapor annealing the film thickness of the polymer mixture 116 may swell to several times its initial thickness due to the ingress of solvent into the polymer mixture 116. The swelling of the polymer mixture 116 creates space between the polymers comprising the polymer mixture 116 which increases the chain mobility of the polymer mixture 116 and may cause microphase separation (i.e. self-assembly). In other embodiments an additional quenching step may be required to cause microphase separation. The solvent vapor used for solvent annealing may comprise toluene vapor or heptane vapor, for example.

For example, in one embodiment, after microphase separation, a first set of cylinders 120 comprising the minority first polymer are embedded in a matrix 118 comprising the majority second polymer within the plurality of cavities 112 and the plurality of outer spaces 113.

As understood by those with ordinary skill in the art, a pinning structure is required order to control the orientation and formation pattern of the first set of cylinders 120 or the first set of cylinders will form in a random uncontrollable pattern referred herein as a "finger print" pattern. Therefore, as illustrated in FIG. 1D, the cylinders of the first set of cylinders 120 formed in the plurality of outer spaces 113 are not within plurality of cavities 112, and therefore, are outside of the pinning structure and form cylinders in a random pattern while the cylinders of the first set of cylinders 120 formed within the plurality of cavities (i.e. within the pinning structure) form in a controllable pattern.

The first set of cylinders 120 within the plurality of cavities 112 run perpendicular to the first nano-sheet 102 and the second nano-sheet 104. The first set of cylinders may be routed to extend into adjacent cavities formed by adjacent vertical stacks of nano-sheets or nano-wires formed in the horizontal plane across the working surface of the substrate and form interconnects between terminals of transistors formed in adjacent vertical stacks of nano-sheets (or nano-wires).

In various embodiments, the solvent vapor used during solvent annealing may be selected to be highly selective to the minority polymer of the polymer mixture 116 (i.e. the polymer that forms the first set of cylinders 120). During solvent annealing, the solid-liquid interface moves vertically upward, towards the substrate-vapor interface, and preferentially incorporates the minority polymer. Thus, the excess minority polymer curves upwards vertically past the nano-sheets into larger agglomerates, which may be also used to form contact pads in some embodiments. The curving of the minority polymer cylinders can be controlled by controlling the solvent annealing process parameters such as vapor pressure and temperature of annealing in various embodiments.

Advantageously, in various embodiments, the portions of the first set of cylinders 120 that extend out of the plurality of cavities 112 may form an elbow shape and bend upwards and even 90 degrees in one embodiment. This enables the formation of interconnects within the vertically stacked nano-sheets or nano-wires as discussed in another embodiment below. Advantageously, as described above, in some embodiments where self-alignment is caused by solvent annealing, the portions of the first set of cylinders 120 that extend horizontally past the nano-sheets may bend upwards forming a "U shape" and may provide contact between a transistor formed in the first nano-sheet 102 and a transistor formed in the second nano-sheet 104 or to a contact pad in a upper level.

Figure 1E:
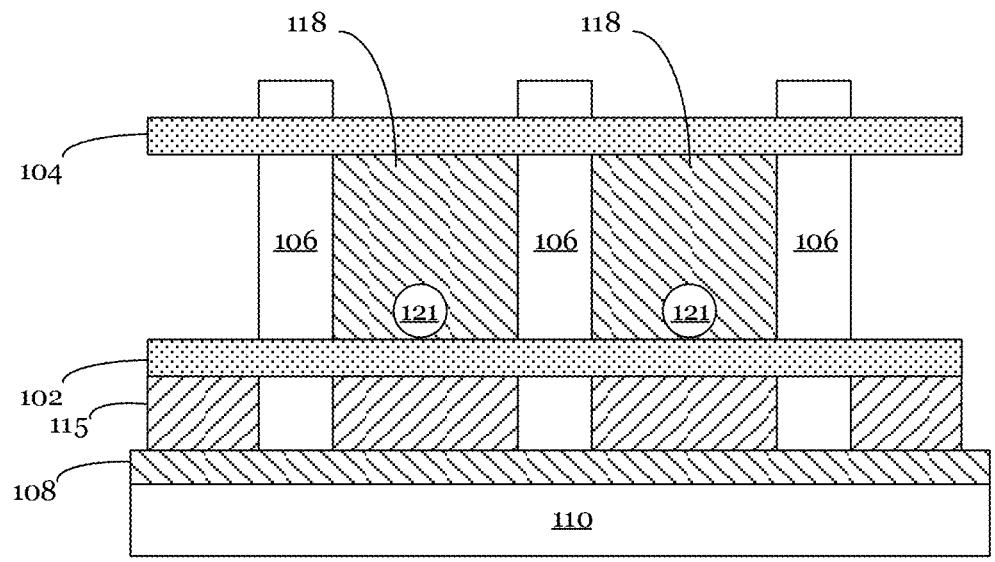

FIG. 1E illustrates removing the first set of cylinders 120 and the matrix 118 formed outside the plurality of cavities 112 and an optional step where the first set of cylinders 120 comprising the first polymer is removed selective to the matrix 118 comprising the second polymer.

The cylinders of the first set of cylinders 120 and the matrix 118 formed outside the plurality of cavities 112 are removed in an etching process in various embodiments. The subsequent etching step may comprise a combination of etching processes. A timed wet etch or a planarization process may be used to remove the matrix 118 including the cylinder above the second nano-sheet 104. This may be followed by a masked etch process using an anisotropic etching process to remove the matrix 118 surrounding the plurality of cavities 112.

In some embodiments, unused cylinders of the first set of cylinders 120 may be formed within the plurality of cavities 112 and across the working surface of the substrate 114. These unused cylinders of the first set of cylinders 120 may be removed by forming an etch mask (i.e., a cut mask) and using a lithography process to selectively remove them.

Optionally, as known to a person having ordinary skill in the art, the first set of cylinders 120 are removed using an isotropic wet process that selectively removes the first polymer to form cylindrical openings 121. Advantageously, in some embodiments, the first polymer and the second polymer of the polymer mixture 116 are controllable by synthetically tailoring the first polymer and the second polymer when forming the polymer mixture 116 to ensure that the etching process is more selective to etch the first polymer than the second polymer (or vice versa in other embodiments). After the first set of cylinders 120 are removed, the cylindrical openings 121 are metalized to become functioning interconnects by filling them with a metal in a subsequent step.

In other embodiments, the first set of cylinders 120 may be metalized directly by infiltrating or embedding the first set of cylinders 120 with a metal, making removing the first set of cylinders 120 unnecessary.

Figure 1F:
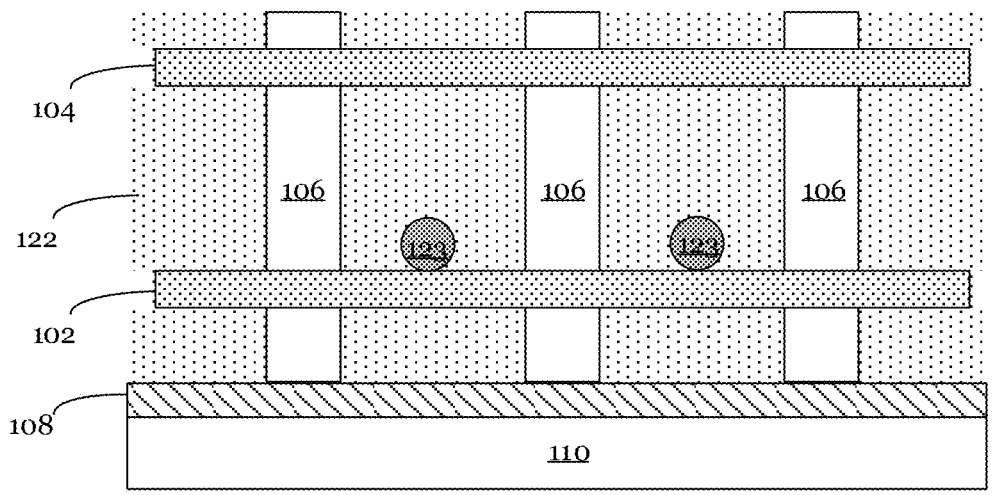

Referring to FIG. 1F, structures formed between the vertical stacks of nano-sheets are converted into functional interconnects. In some embodiments, where the first polymer comprising the first set of cylinders 120 is removed, the structures are metalized by filling the cylindrical openings 121 using a deposition process. In one or more embodiments, Atomic layer deposition can be used to deposit materials from ALD precursors into polymer blocks with specific chemistries such as PMMA. For example, the cylindrical openings 121 may be filled with a metal using an atomic layer deposition process (ALD), where a metal such as platinum may be deposited using an ALD precursor.

As mentioned above, the polymer mixture 116 is formed with polymers having specific chemistries that are selective to metal deposition in order to metalize the first set of cylinders 120 using a deposition process.

In other embodiments, where the first set of cylinders 120 are not selectively removed, the interconnections may be metalized by imbedding or infiltrating metal particles into the voids of the first set of cylinders 120. In some embodiments, the first set of cylinders 120 may be metalized by imbedding or infiltration using a sequential infiltration process (SIS), for example.

In various embodiments, the SIS process may include a plurality of alternating exposures of the self-assembled structure to a metal precursor compound and a reactant precursor. The metal precursor compound may comprise trimethyl aluminum (TMA), titanium tetrachloride ($TiCl_4$), diethyl zinc (DEZ), or hexafluoride ($WF_6$). The reactant precursor may comprise an oxygen source (e.g., $H_2O$, $O_2$, $O_3$, $H_2O_2$), a reducing agent ($H_2$, $H_2S_2Si_2H_6$, etc.), or other compounds reactive with the metal precursor compound. A purge step (e.g., $N_2$) may be performed following each precursor exposure to remove residual reactant. Exposures of each reactant can be performed in one step or in a series of two or more steps to control the amount of material that infiltrates the first set of cylinders 120. In various embodiments the metal precursor has an affinity to the minority polymer of the polymer mixture 116 that forms the first set of cylinders 120 and infiltrates the surface of the minority polymer (i.e. the surfaces of the first set of cylinders 120). The reactant precursor completes the reaction with the metal precursor compound formed on the surface of the minority polymer and forms a set of first set of metalized cylinders 123. Examples of metals formed by the SIS process may include gold, palladium, $Al_2O_3$, $TiO_2$, ZnO, $SiO_2$, or $HfO_2$, for example.

In other embodiments the first set of cylinders 120 may be metalized using a vapor phase infiltration process (VPI), vapor phase infiltration (VPI), or multiphase vapor infiltration (VPI), for example.

As understood by those with ordinary skill in the art, after forming functional interconnects a filler material 122 may be formed within the outer spaces 113 in order to isolate each vertical stack of nano-wires or nano-sheets to prevent cross-talk between adjacent vertical stacks of nano-wires or nano-sheets, current injections, shorting, and other problems. The filler material 122 may comprise an isolating oxide such as silicon oxide, silicon dioxide, or silicon nitride and may be formed using a local oxidization of silicon process (LOCOS) or any other method known in the art.

Figure 2:
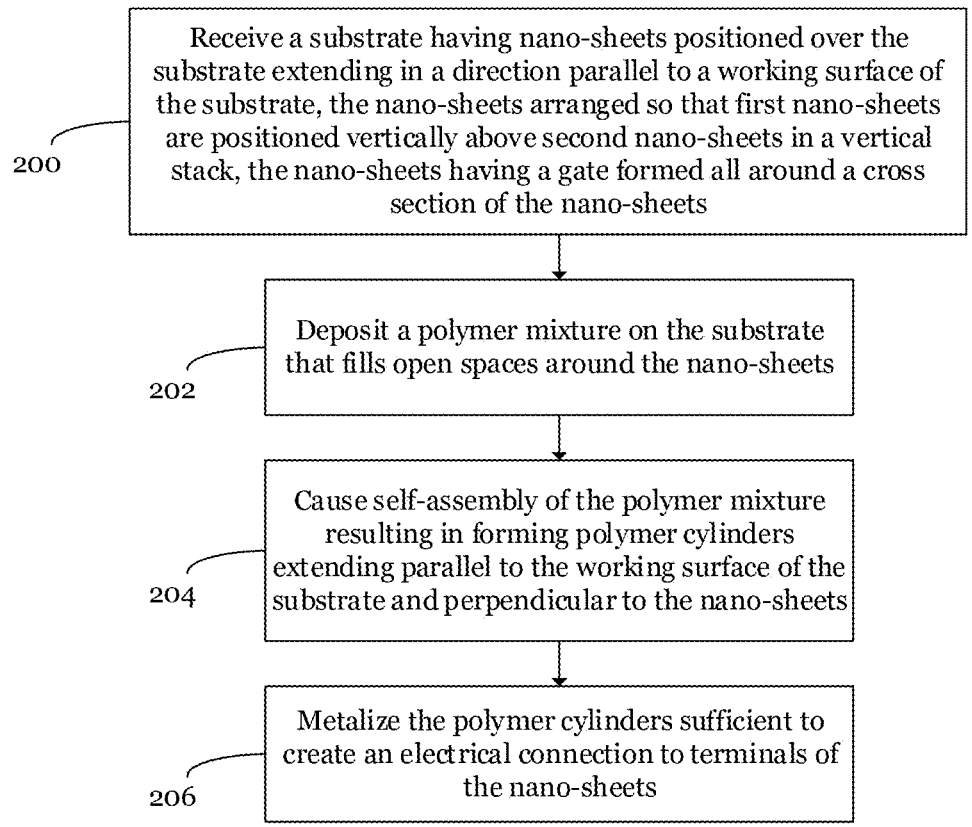
FIG. 2 is a flow chart illustrating an example process flow of a process used to form interconnects within a 3D integrated device in accordance to an embodiment of the present application.

FIG. 2 is a flow chart illustrating an example process flow of a process used to form interconnects within a 3D integrated device in accordance to an embodiment of the present application.

As illustrated in block 200 and described with reference to FIG. 1A, vertically stacked nano-sheets are formed over the substrate in a direction parallel to a working surface of the substrate, the nano-sheets having gates 106 formed all around a cross-section of the nano-sheets. A plurality of nano-channels and a plurality of cavities 112 are formed by the intersection of a first nano-sheet 102 and a second nano-sheet 104 and the gates 106. The first nano-sheet 102 and the second nano-sheet 104 and the gates 106 may be formed as known to a person having ordinary skill in the art, and may comprise the materials as described in FIG. 1A.

As next illustrated in block 202, and described with reference to FIG. 1C, the plurality of cavities 112 and outer spaces 113 are filled with a polymer mixture 116 that fills the open spaces.

As next illustrated in block 204, and described with reference to FIG. 1D, the polymer mixture 116 undergoes self-assembly, forming a first set of cylinders 120 comprising a first polymer (minority) material of the polymer mixture surrounded by a matrix 118 (majority polymer) of the polymer mixture 116.

As next illustrated in block 206 and described with reference to FIGS. 1E-1F, the first set of cylinders 120 are metalized, forming functional interconnects between the terminals of transistors formed in adjacent stacks of nano-sheets formed across the horizontal plane formed by the working surface of the substrate 114. The first set of cylinders 120 are metalized by either selectively removing the first set of cylinders 120, as described in FIG. 1E, and using a metal deposition process, or using imbedding/infiltration in the same manner described in FIG. 1F. As explained above, the matrix 118 is removed and a filler material 122 is formed around the outer spaces 113 in order to isolate the vertical stack of nano-sheets.

Figure 3A:
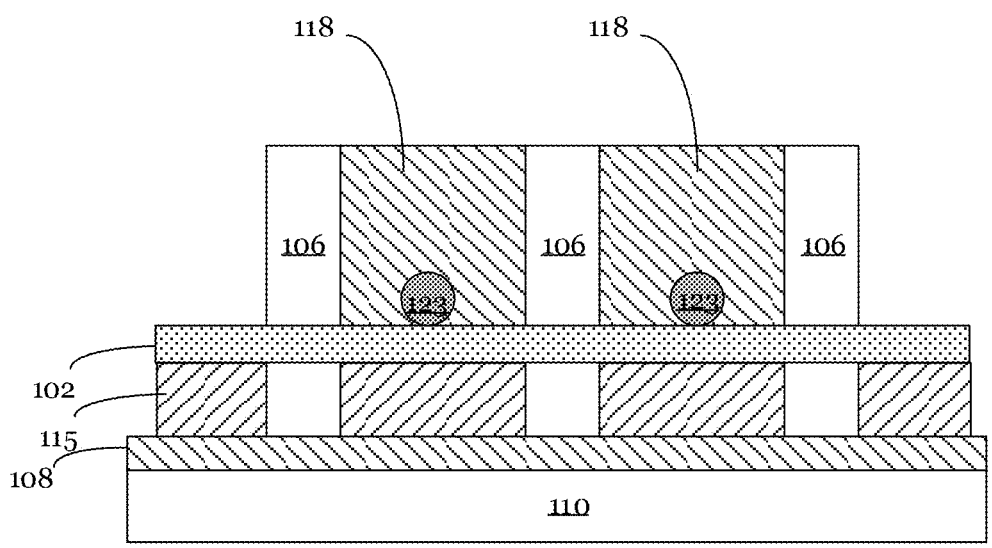
Figure 3B:
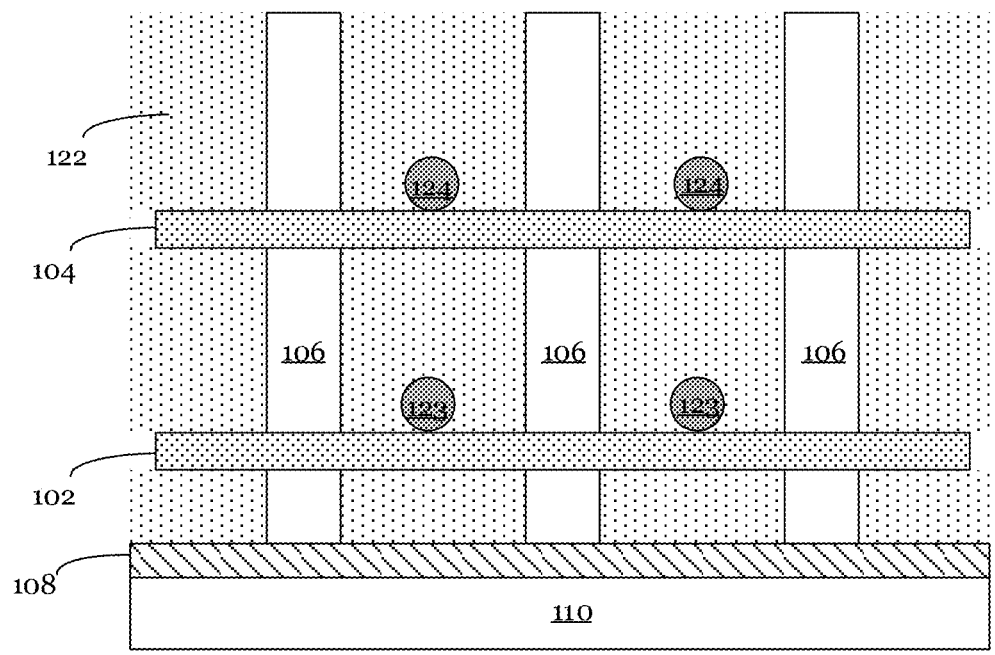

FIGS. 3A-3B illustrate an alternative embodiment of the present application where FIGS. 3A-3B illustrate cross-sectional views of a semiconductor device during various stages of fabrication in accordance with an embodiment of the present application, wherein FIG. 3A illustrates a cross-sectional view of the device after forming a first nano-sheet with a respective first set of interconnects, and FIG. 3B illustrates a cross-sectional view of the device after forming a second nano-sheet and a respective second set of interconnects.

Unlike the prior embodiments, in this embodiment, the interconnects are formed (or at least the pattern for interconnects without the final metallization) at each level before forming the next level of nano-sheets. Accordingly referring to FIG. 3A, a first nano-sheet 102 physically supported by gates 106 surrounding the first nano-sheet 102 is formed over an insulating layer 108 formed over a substrate no. The first nano-sheet 102, the gates 106, the insulating layer 108, and the substrate no may be formed as known to a person having ordinary skill in the art and may comprise the same material described in FIG. 1A.

While the first nano-sheet 102 may be functionalized, e.g., doped to selectively attract the second polymer to form cylindrical structures contacting the first nano-sheet 102, there is no competing surface from an overlying nano-sheet. Thus, this embodiment may be used when both levels of nano-sheets (i.e., first nano-sheet 102 and the to be formed second nano-sheet 104) are functionalized similarly, for example, both are pmos devices or both are nmos devices.

As described in prior embodiments, after functionalizing the first nano-sheet 102 to be attractive to a minority polymer of a first self-aligning polymer mixture, the first self-aligning polymer mixture is coated over the substrate no. The first self-aligning polymer mixture fills the cavities formed between the first nano-sheet 102 and the gates 106 and the areas surrounding the first nano-sheet 102 and the gates 106 in the same manner described in FIG. 1C. As also explained above with respect to FIG. 1C, a fill material 115 may be coated between the cavity formed between the first nano-sheet 102 and the insulating layer 108.

After coating the substrate no with the first self-aligning polymer mixture, the first self-aligning polymer mixture undergoes microphase separation and forms cylinders containing blocks of the minority polymer with a matrix 118 containing blocks of a majority polymer. As explained above, the cylinders formed outside the plurality of cavities may be removed while the cylinders within the plurality of cavities are metallized to form a first set of metalized cylinders 123. One advantage of this is that the matrix 118 serves as a surface material masking the first nano-sheet 102 and allows for additional functionalized nano-sheets and interconnects to be formed above the first nano-sheet 102 while the first nano-sheet 102 remains masked and unaffected. Thus, in this embodiment, the subsequent nano-sheet may be functionalized similar to the first nano-sheet 102.

Referring to FIG. 3B, a second nano-sheet 104 physically supported by gates 106 surrounding the second nano-sheet 104 is formed over the first nano-sheet 102. The second nano-sheet 104 and the gates 106 may be formed as known to a person having ordinary skill in the art and may comprise the same materials formed in FIG. 1A. After forming the second nano-sheet 104, the second nano-sheet 104 may be functionalized as described in FIG. 3A. Then a second self-aligning polymer mixture is coated over the substrate no in the same manner described in FIG. 3A. In one or more embodiments, the second self-aligning polymer mixture may be tuned or formulated to form interconnects with a different critical dimension, pitch, microphase separation, volume fraction, interaction parameter, and the degree of polymerization than the first self-aligning polymer mixture. In one embodiment, the second self-aligning polymer mixture and the first self-aligning polymer mixture may comprise the same polymers but may be tuned by having a different molecular weight than the first self-aligning polymer mixture. In one embodiment, the second self-aligning polymer mixture may be tuned by having a different chemical composition than the first self-aligning polymer mixture. In one or more embodiments, the first self-aligning polymer mixture and the second self-aligning polymer mixture may comprise the exact same material in order to form two sets of the cylinders having similar critical dimensions and pitch.

The second self-aligning polymer mixture fills the cavities formed by intersection of the second nano-sheet 104 and the gates 106 and the areas surrounding the second nano-sheet 104 and the gates 106 in the same manner described in FIG. 1C. Meanwhile, the cavities formed by the intersection of the first nano-sheet 102 and the gates 106 remain masked by the matrix material of the first self-aligning polymer mixture.

After coating the substrate 110 with the second self-aligning polymer mixture, the second self-aligning polymer mixture undergoes microphase separation and forms a second set of cylinders that are self-aligned to a transistor of the second nano-sheet 104 within the cavities in the same manner described in FIG. 3A above. As explained above, the cylinders of the second set of cylinders that formed in the areas surrounding the second nano-sheet 104 and the gates 106 form an uncontrollable "finger print" pattern and are removed in the same manner described in FIG. 3A above.

In one or more embodiments, unwanted cylinders of the second set of cylinders may be formed within the cavities and are removed by forming an etch mask and using a lithography process as described in FIG. 3A.

After the unwanted cylinders of the second set of cylinders are removed, the remaining cylinders of the second set of cylinders are metalized, forming a second set of metalized cylinders 124 by either selectively removing the second set of cylinders and forming cylindrical openings, as described in FIG. 1E, and filling the cylindrical openings using a metal deposition process, or using imbedding/infiltration in the same manner described in FIG. 1F.

After forming the second set of metalized cylinders 124, the matrix 118 of the first self-aligning polymer mixture, the matrix material of the second self-aligning polymer mixture, and the fill material 115 are removed, and the open areas surrounding the vertical stack comprising the first nano-sheet 102 and the second nano-sheet 104 are isolated by being filled with a filler material 122 in the same manner described in FIG. if. Alternately, in some embodiments, the matrix 118 of the first self-aligning polymer mixture, the matrix material of the second self-aligning polymer mixture form the isolation of the device and hence are not removed and replaced with an insulating fill material.

In various embodiments multiple sets of interconnects having different orientations morphologies, and/or junctions may be formed within vertical structures comprising multiple stacks of nano-lines (i.e. multiple stacks of nano-sheets or nano-wires). Accordingly, one or more embodiments will be described using the cross-sectional FIGS. 4A-4D along with the flow chart of FIG. 5.

Figure 4A:
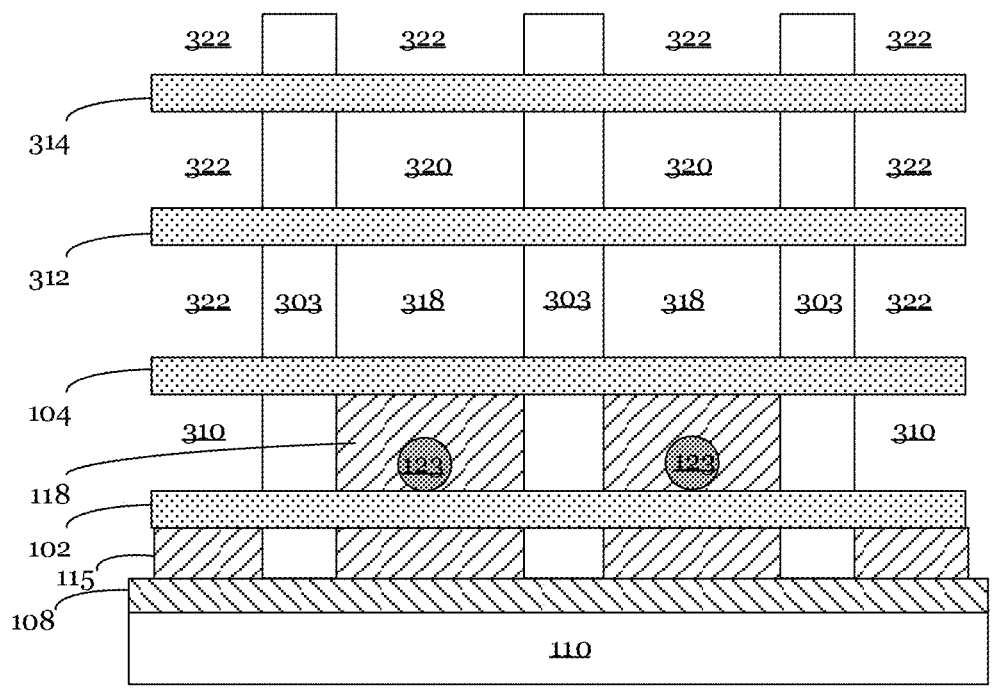
FIGS. 4A-4D illustrate cross-sectional views of a semiconductor device during various stages of fabrication in accordance with an embodiment of the present application.
Figure 4B:
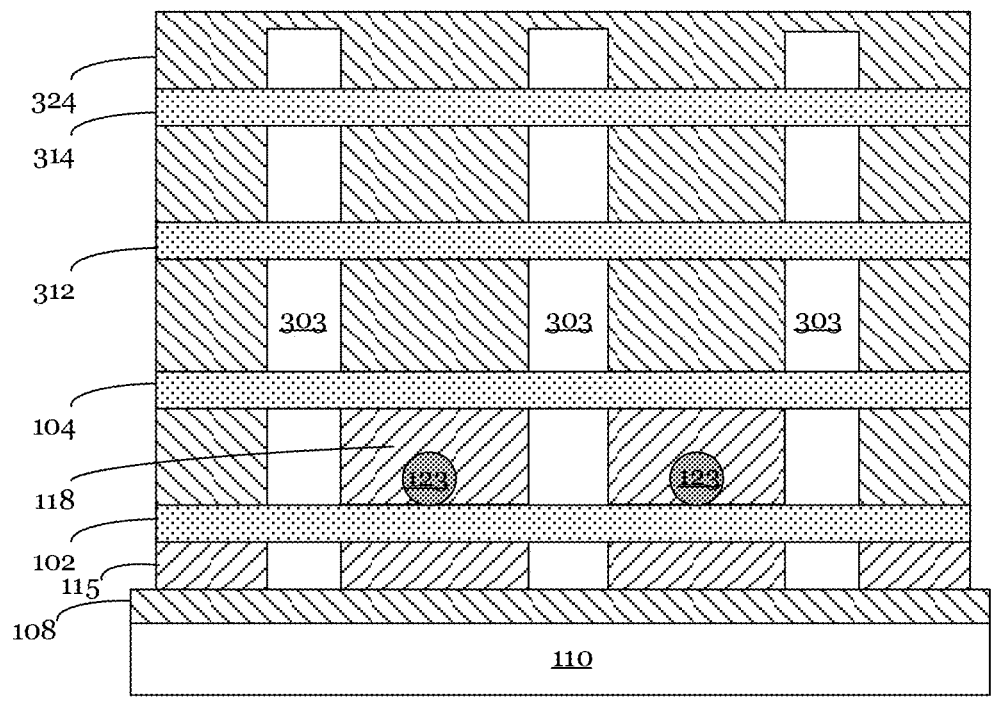
Figure 4C:
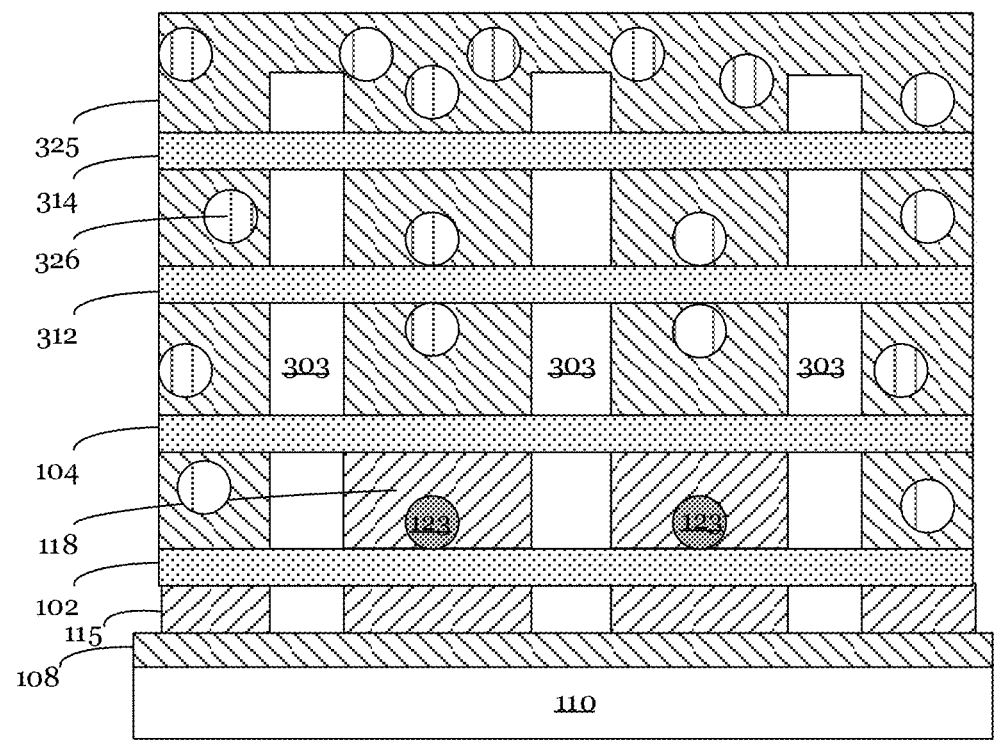
Figure 4D:
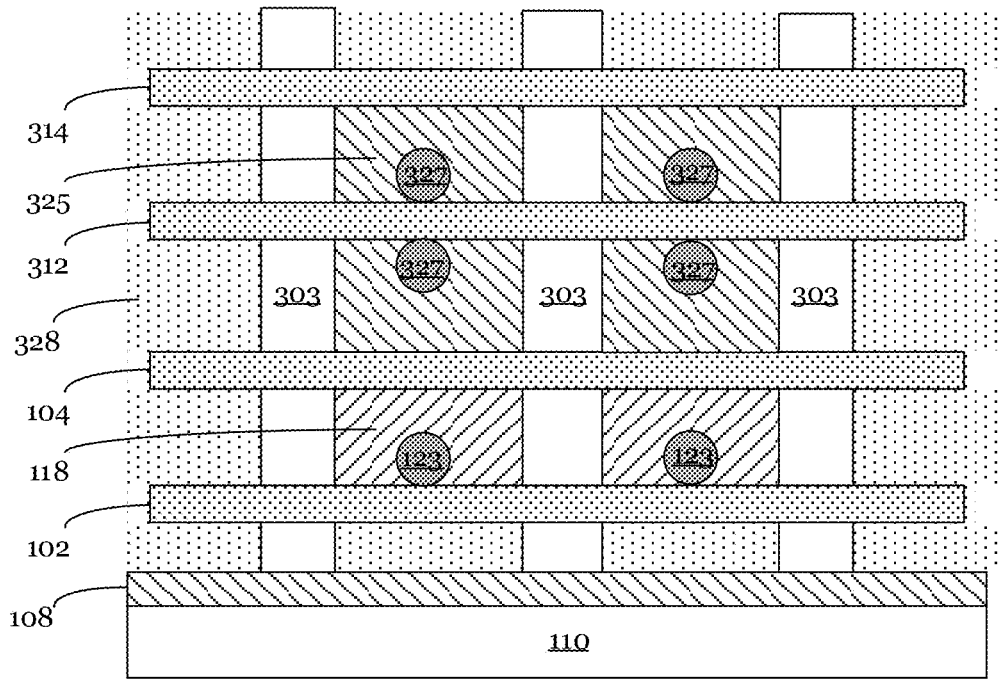

FIGS. 4A-4D illustrate cross-sectional views of a semiconductor device during various stages of fabrication in accordance with an embodiment of the present application, wherein FIG. 4A illustrates a cross-sectional view of the device after forming a second stack of nano-sheets, FIG. 4B illustrates a cross-sectional view of the device after coating the device with a second self-assembling polymer mixture, FIG. 4C illustrates a cross-sectional view the device after causing self-assembly of the second polymer mixture in order to form a second pattern for interconnects, and FIG. 4D illustrates a cross-sectional view of the device after metalizing the second pattern for interconnects to form functional interconnects and isolating the device from adjacent devices.

Unlike the embodiments described before, embodiments of present application include forming multiple vertical levels of interconnects. As also illustrated in this embodiment, some of the vertical levels of interconnects may be formed together in a single DSA process. As an illustration, this embodiment builds on the embodiment described in FIGS. 1A-1F by forming additional vertical levels of interconnect starting from the structure of FIG. 1F (block 500 of FIG. 5).

In one embodiment, after forming the first set of metalized cylinders 123 as described in FIGS. 1A-1F, a second stack of a plurality of nano-sheets may be formed and a second set of horizontally routed interconnects may be formed using a second directed-self assembly process, as illustrated in FIGS. 4A-4C.

Advantageously, in one or more embodiments, multiple sets of interconnects having different orientations and/or junctions may be formed independently from each other using a separate directed self-assembly processes.

Figure 5:
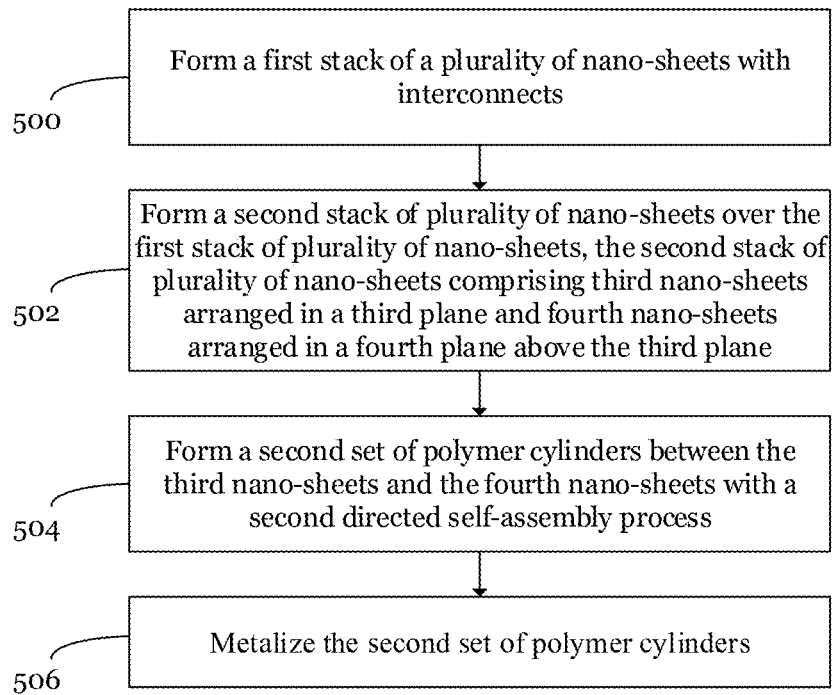
FIG. 5 is a flow chart illustrating an example process flow of a process used to form interconnects within a 3D integrated device comprising multiple stacks of nano-sheets using two directed-self assembly processes in accordance to an embodiment of the present application.

Referring to FIG. 4A and block 502 of FIG. 5, a second stack of a plurality of nano-lines comprising fourth nano-sheets 314 arranged in a fourth plane is stacked above third nano-sheets 312 arranged in a third plane. The third plane and the fourth plane are arranged in a direction parallel to the working surface of the substrate, and therefore, the first nano-sheets 102, the second nano-sheets 104, the third nano-sheets 312, and the fourth nano-sheets 314 are all parallel to each other. However, in some embodiments, some of the nano-sheets, for example, the third nano-sheets 312, and the fourth nano-sheets 314 may be oriented perpendicular to the first nano-sheets 102 and the second nano-sheets 104.

In one or more embodiments, the second stack of a plurality of nano-sheets including the third nano-sheets 312 and the fourth nano-sheets 314 may comprise the same material as the first stack of a plurality of nano-sheets, e.g., the first nano-sheets 102 and the third nano-sheets 312 may be the same material.

In various embodiments, as explained above, the third nano-sheets 312 and the fourth nano-sheets 314 may be functionalized to have different doping or different material, or may be functionalized using a masking process to form interconnects independently as described in FIG. 3.

The third nano-sheets 312 and the fourth nano-sheets 314 are surrounded by gates 303 and include a second plurality of open spaces 318, a second plurality of outer openings 322, and a third plurality of open spaces 320 in a similar manner described in FIG. 1A.

Referring to FIG. 4B, the substrate no is coated with a second polymer mixture 324 and fills the second plurality of open spaces 318, the third plurality of open spaces 320, the first plurality of outer openings 310, and the second plurality of outer openings 322 in order to form a second set of interconnects. The second polymer mixture 324 may be a block copolymer as described with respect to the polymer mixture 116 described above. However, the composition of the second polymer mixture 324 may be different from the composition of the polymer mixture 116.

In one or more embodiments, for illustration, the nano-sheets may be functionalized in a manner such that the minority polymer (cylinder forming polymer material) is attracted to the third nano-sheets 312 or second nano-sheets 104 and the fourth nano-sheets 314 (or vice versa). The actual pattern being formed is therefore quite flexible allowing the designer to lay out interconnects in different patterns.

Referring to FIG. 4C and block 504 of FIG. 5, the second polymer mixture 324 undergoes microphase separation to form a second set of self-aligning structures comprising a second set of cylinders 326 between the second nano-sheets 104 and the third nano-sheets 312, and between the third nano-sheets 312 and the fourth nano-sheets 314 similar to the process described in FIG. 1D above.

The second set of cylinders 326 may self-align to transistors formed within the third nano-sheets 312 in both the second plurality of open spaces 318 and the third plurality of open spaces 320 due to how the nano-sheets are functionalized. The second set of cylinders 326 may comprise the first (minority) polymer of the second polymer mixture 324 and are surrounded by a matrix material 325 comprising the second (majority) polymer of the second polymer mixture 324.

In one or more embodiments, as described above, multiple cylinders of the second set of cylinders 326 may be formed between the second nano-sheets 104 and the third nano-sheets 312, and between the third nano-sheets 312 and the fourth nano-sheets 314, such that the quantity of cylinders comprising the first set of cylinders 120 and the second set of cylinders 326 may be different.

Similar to as described above with respect to FIG. 1E, the cylinders of the second set of cylinders 326 formed in the first plurality of outer openings 310 are removed.

Referring to FIG. 4D and block 506 of FIG. 5, the second set of cylinders 326 are metalized, forming a second set of functionalized cylinders 327. In one or more embodiments, the second set of cylinders 326 may be removed forming cylindrical openings that are filled with a metal using a deposition process in the same manner described and illustrated in FIG. 1F. In one or more embodiments, the second set of cylinders 326 are metalized via infiltration or embedding as described in FIG. 1F.

After forming a second set of functionalized cylinders 327, the matrix material 325 of the second polymer mixture 324 is removed in the same manner described in FIG. 1E, and the second plurality of outer openings 322 are isolated by being filled with an insulating filler material 328, for example, as described in FIG. 1F.

Figure 6:
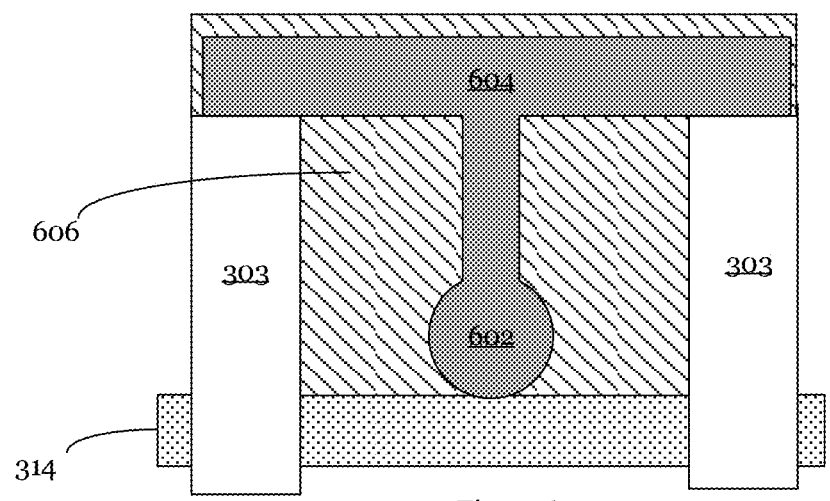

Accordingly, FIG. 6 illustrates a cross-sectional view of a semiconductor device during a stage of fabrication in accordance with an embodiment of the present application, wherein FIG. 6 illustrates a cross-sectional view of the device after global interconnects are formed over vertical stacks of nano-sheets.

Referring to FIG. 6, the open spaces above the fourth nano-sheets 314 formed between adjacent gates 303 may be coated with an additional bilayer di-block copolymer mixture (e.g., in step shown in FIG. 1C or 4B), which may also be the overfill in FIG. 1C or 4B. In this embodiment, the pinning structure formed above the gates 303 and the fourth nano-sheets 314 may enable formation of the interconnect that is oriented perpendicular to the layer below. For example, a subsequent nano-sheet above the fourth nano-sheets 314 may be oriented perpendicular to the fourth nano-sheets 314.

Accordingly, as explained above, for example, a third set of cylinders 602 and a fourth set of cylinders 604 that comprise a first polymer of the additional bilayer di-block copolymer mixture may be formed orthogonal to each other with the third set of cylinders 602 extending in directions perpendicular to the nano-sheets and the fourth set of cylinders 604 formed above the gates 303 in a direction parallel to the nano-sheets formed in a matrix material comprising a second polymer 606 of the additional bilayer di-block copolymer mixture. The third set of cylinders 602 and the fourth set of cylinders 604 may also intersect each other and may connect in a plurality of locations, forming "T-shaped" junctions. For example, the fourth set of cylinders 604 may function as global interconnects.

The third set of cylinders 602 and the fourth set of cylinders 604 may be formed and metalized using the directed self-assembly process and metallization process described in FIGS. 1C-1F as described above.

In various embodiments, as described above, when coating the substrate with a self-aligning polymer mixture, cylinders may also be formed within the open areas of the working surface of the substrate 114. The cylinders formed in open areas of the working surface of the substrate 114 may be used to route interconnects between vertically stacked nano-sheets or nano-wires that are not perfectly adjacent to one another and route interconnects between different levels of different vertical stacks of nano-sheets or nano-wires.

Figure 7A:
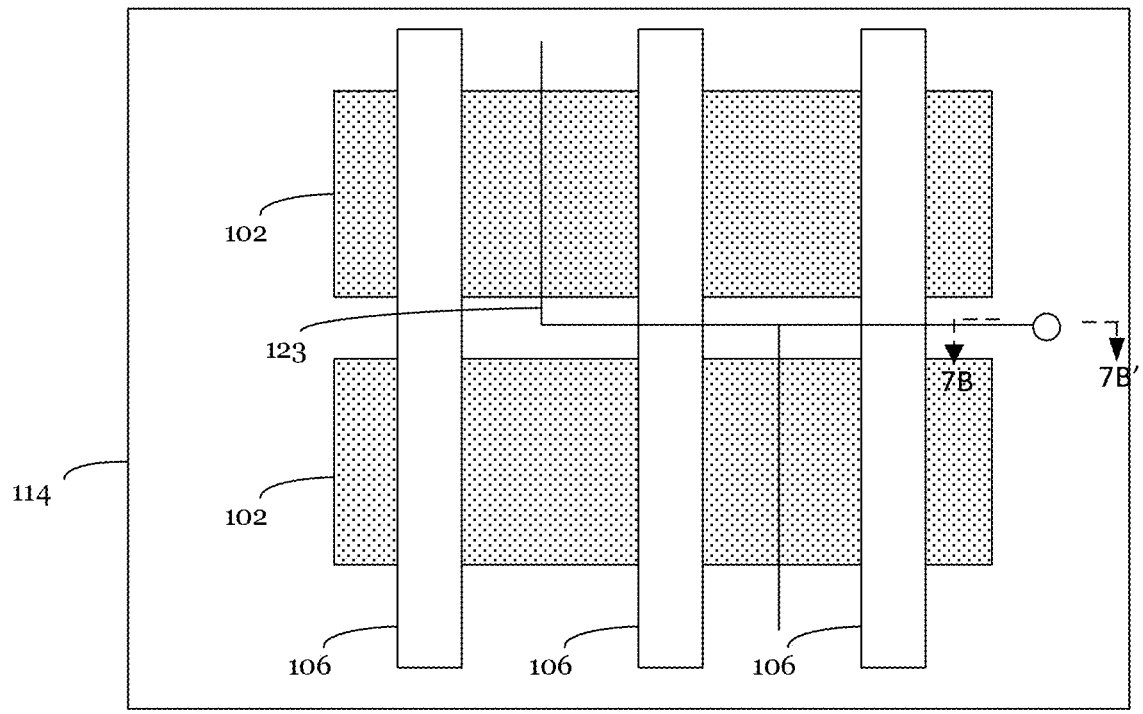
Figure 7B:
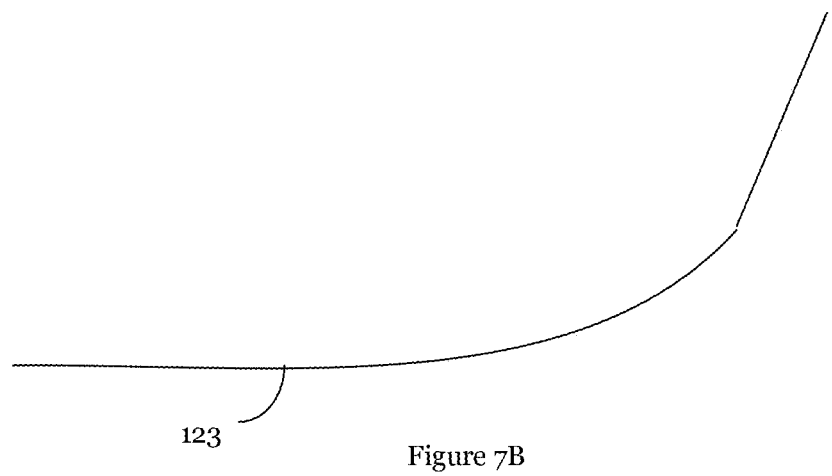

FIGS. 7A-7B illustrate cross-sectional views of a semiconductor device during a stage of fabrication in accordance with an embodiment of the present application, wherein FIG. 7A illustrates a top view of the device after interconnects are routed between different vertical stacks of nano-sheets or nano-wires across the working surface of the substrate, and FIG. 7B illustrates a cross-sectional view of an upward angled interconnect.

FIG. 7A illustrates a top view of the vertical stack of nano-sheets formed in FIG. 1. As illustrated in FIG. 7A, the first set of metalized cylinders 123 formed between vertical stacks of nano-sheets or nano-wires such as the second nano-sheets 104 may be routed in a variety of orientations and may connect to other functionalized cylinders extending out of other vertical stacks of nano-sheets or nano-wires formed across the horizontal surface of the substrate 114. For example, in one or more embodiments, a cylinder of the first set of metalized cylinders 123 aligned to a terminal of a transistor of the second nano-sheet 104 may be routed to connect to a terminal in a transistor of a first nano-sheet 102 of another vertical stack of nano-sheets that is not directionally adjacent across the horizontal plane of the working surface of the substrate 114.

In one or more embodiments, where microphase separation is caused by solvent annealing, the portions of the first set of cylinders 120 that extend out of the plurality of cavities 112 may bend vertically on each end after they are quenched in the same manner described in FIG. 1D above. A cross-sectional view of a metalized cylinder with a vertical bend can be seen in FIG. 7B across the line 7B-7B' of FIG. 7A.

Referring to FIG. 7B, in one or more embodiments, the portions of the metalized cylinders 123 that extend out of the plurality of cavities 112 may form an elbow shape and bend upwards to an angle of 9 degree in one embodiment. One advantage of this is that is allows for the formation of interconnects between transistors of different nano-sheets within the same vertical stack of nano-sheets and/or the formation of interconnects within the same vertical stack of nano-sheets that connect vertically and eventually connect to a global interconnect formed above the vertical stacks of nano-sheets as described in FIG. 6. Accordingly, embodiment of the present application also include forming a physical contact, i.e., an electrical connection to another interconnect.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

Example embodiments of the present invention are summarized here. Other embodiments can also be understood from the entirety of the specification and the claims filed herein.

Example 1. A method of forming a device, the method including: receiving a substrate having nano-channels positioned over the substrate and extending in a direction parallel to a working surface of the substrate, the nano-channels arranged so that first nano-channels are positioned vertically above second nano-channels in a vertical stack, the nano-channels having a gate formed all around a cross section of the nano-channels; depositing a polymer mixture on the substrate that fills open spaces around the nano-channels; causing self-assembly of the polymer mixture resulting in forming polymer cylinders extending parallel to the working surface of the substrate and perpendicular to the nano-channels; and metalizing the polymer cylinders sufficient to create an electrical connection to terminals of the nano-channels. The method may further include metalizing the polymer cylinders sufficient to create an electrical connection to another interconnect. As described in various embodiment, this process may be selectively performed by the use of pinning structures (designed cavities) provided by the 3-D structure of the device being fabricated.

Example 2. The method of example 1, where causing self-assembly of the polymer mixture includes forming first cylinders and second cylinders, the first cylinders formed of a first material while the second cylinders are formed of a second material, the first and second material being different.

Example 3. The method of one of examples 1 or 2, where metalizing the polymer cylinders include causing a first metal to infiltrate material of the polymer cylinders.

Example 4. The method of one of examples 1 to 3, where a second polymer from the polymer mixture occupies space around the cylinders, and where metalizing the polymer cylinders include removing the polymer cylinders and replacing with a first metal.

Example 5. The method of one of examples 1 to 4, where the polymer cylinders extend into an adjacent trench.

Example 6. A method of forming a device, the method including: receiving a substrate having a three dimensional (3D) structure including a plurality of nano-sheets, a plurality of walls, and a plurality of cavities, one of the plurality of nano-sheets including a first sheet separated from a second sheet of the plurality of nano-sheets in a first direction by one of the plurality of cavities, the plurality of nano-sheets being supported by the plurality of walls, the plurality of nano-sheets extending along a second direction orthogonal to the first direction, the first sheet being spaced apart from a third sheet of the plurality of nano-sheets along a horizontal plane in a third direction that is orthogonal to both the first and the second directions; and forming a plurality of cylindrical interconnects within the 3D structure with a directed self assembly process, where each of the plurality of cavities includes one of the plurality of cylindrical interconnects.

Example 7. The method of example 6, where forming the plurality of cylindrical interconnects includes: performing a solvent annealing process to form a first interconnect extending in the first direction, a second interconnect extending in the second direction, and a third interconnect extending in the third direction, the first interconnect, the second interconnect, and the third interconnect being electrically coupled to each other.

Example 8. The method of one of examples 6 or 7, where forming the plurality of cylindrical interconnects includes: filling the plurality of cavities with a polymer mixture including a block copolymer; converting the polymer mixture to form a plurality of polymer cylinders, where each of the plurality of cavities includes one of the polymer cylinders; and metalizing the plurality of polymer cylinders.

Example 9. The method of one of examples 6 to 8, where forming the plurality of cylindrical interconnects includes: selectively contacting each of the plurality of polymer cylinders with a selected one of the plurality of nano-sheets; or selectively contacting one of the plurality of polymer cylinders with another interconnect within the 3D structure.

Example 10. The method of one of examples 6 to 9, where the selectively contacting includes having functionalized nano-sheets within the plurality of nano-sheets and preferentially attracting the plurality of polymer cylinders during the directed self assembly process towards the functionalized nano-sheets.

Example 11. The method of one of examples 6 to 10, where the plurality of polymer cylinders include a first set of polymer cylinders including a first polymer material and a second set of polymer cylinders including a second polymer material, the first polymer material being a different polymer material than the second polymer material.

Example 12. The method of one of examples 6 to 11, where metalizing the plurality of polymer cylinders further includes infiltrating a metal into the plurality of polymer cylinders.

Example 13. The method of one of examples 6 to 12, where the plurality of polymer cylinders include a first polymer material that is surrounded by a second polymer material, and where metalizing the polymer cylinders further includes removing the plurality of polymer cylinders forming a plurality of cylindrical openings, and filling the plurality of cylindrical openings with a metal.

Example 14. A method of forming a device, the method including: forming a first stack of plurality of nano-lines over a substrate, the first stack of plurality of nano-lines including first nano-lines arranged in a first plane above the substrate and second nano-lines arranged in a second plane above the first plane; and forming a first set of polymer cylinders between the first nano-lines and the second nano-lines with a first directed self-assembly process.

Example 15. The method of example 14, where the first directed self-assembly process further includes: filling a cavity between the first plane and the second plane with a first polymer mixture including a di-block copolymer; converting the first polymer mixture to form the first set of polymer cylinders; and metalizing the first set of polymer cylinders.

Example 16. The method of one of examples 14 or 15, further including: forming a second stack of plurality of nano-lines over the first stack of plurality of nano-lines, the second stack of plurality of nano-lines including third nano-lines arranged in a third plane above the second plane and fourth nano-lines arranged in a fourth plane above the third plane; and forming a second set of polymer cylinders between the third nano-lines and the fourth nano-lines with a second directed self-assembly process.

Example 17. The method of one of examples 14 to 16, where the second directed self-assembly process further includes: filling a cavity between the third plane and the fourth plane with a second polymer mixture including a multi-block copolymer; and converting the second polymer mixture to form the second set of polymer cylinders; and metalizing the second set of polymer cylinders.

Example 18. The method of one of examples 14 to 17, further including: forming the second stack of plurality of nano-lines over the first stack of plurality of nano-lines prior to forming the first set of polymer cylinders, the second stack of plurality of nano-lines including third nano-lines arranged in a third plane above the second plane and fourth nano-lines arranged in a fourth plane above the third plane; filling a first cavity between the first plane and the second plane and a second cavity between the third plane and the fourth plane with a polymer mixture including a multi-block copolymer; converting the polymer mixture to form the first set of polymer cylinders including a first polymer material between the first plane and the second plane and a second set of polymer cylinders including a second polymer material between the second plane and the third plane; and metalizing the first set of polymer cylinders and the second set of polymer cylinders.

Example 19. The method of one of examples 14 to 18, where the first set of polymer cylinders is oriented orthogonal to the second set of polymer cylinders.

Example 20. The method of one of examples 14 to 19, where the first set of polymer cylinders is attached to the second set of polymer cylinders at a plurality of locations.

What is claimed is:

1. A method of forming a device, the method comprising:
receiving a substrate having nano-channels positioned over the substrate and extending in a direction parallel to a working surface of the substrate, the nano-channels arranged so that first nano-channels are positioned vertically above second nano-channels in a vertical stack, the nano-channels having a gate formed all around a cross section of the nano-channels;
depositing a polymer mixture on the substrate that fills open spaces around the nano-channels;
causing self-assembly of the polymer mixture resulting in forming polymer cylinders extending parallel to the working surface of the substrate and perpendicular to the nano-channels; and
metalizing the polymer cylinders sufficient to create an electrical connection to terminals of the nano-channels.

2. The method of claim 1, wherein causing self-assembly of the polymer mixture comprises forming first cylinders and second cylinders, the first cylinders formed of a first material while the second cylinders are formed of a second material, the first and second material being different.

3. The method of claim 1, wherein metalizing the polymer cylinders include causing a first metal to infiltrate material of the polymer cylinders.

4. The method of claim 1, wherein a second polymer from the polymer mixture occupying space around the cylinders, and wherein metalizing the polymer cylinders include removing the polymer cylinders and replacing with a first metal.

5. The method of claim 1, wherein polymer cylinders extend into an adjacent trench.

6. A method of forming a device, the method comprising:
receiving a substrate having a three dimensional (3D) structure comprising a plurality of nano-sheets, a plurality of walls, and a plurality of cavities, one of the plurality of nano-sheets comprising a first sheet separated from a second sheet of the plurality of nano-sheets in a first direction by one of the plurality of cavities, the plurality of nano-sheets being supported by the plurality of walls, the plurality of nano-sheets extending along a second direction orthogonal to the first direction, the first sheet being spaced apart from a third sheet of the plurality of nano-sheets along a horizontal plane in a third direction that is orthogonal to both the first and the second directions; and
forming a plurality of cylindrical interconnects within the 3D structure with a directed self assembly process, wherein each of the plurality of cavities comprises one of the plurality of cylindrical interconnects.

7. The method of claim 6, wherein forming the plurality of cylindrical interconnects comprises:
performing a solvent annealing process to form a first interconnect extending in the first direction, a second interconnect extending in the second direction, and a third interconnect extending in the third direction, the first interconnect, the second interconnect, and the third interconnect being electrically coupled to each other.

8. The method of claim 6, wherein forming the plurality of cylindrical interconnects comprises:
filling the plurality of cavities with a polymer mixture comprising a block copolymer;
converting the polymer mixture to form a plurality of polymer cylinders, wherein each of the plurality of cavities comprises one of the polymer cylinders; and
metalizing the plurality of polymer cylinders.

9. The method of claim 8, wherein forming the plurality of cylindrical interconnects comprises:
selectively contacting each of the plurality of polymer cylinders with a selected one of the plurality of nano-sheets; or
selectively contacting one of the plurality of polymer cylinders with another interconnect within the 3D structure.

10. The method of claim 9, wherein the selectively contacting comprises having functionalized nano-sheets within the plurality of nano-sheets and preferentially attracting the plurality of polymer cylinders during the directed self assembly process towards the functionalized nano-sheets.

11. The method of claim 8, wherein the plurality of polymer cylinders comprise a first set of polymer cylinders comprising a first polymer material and a second set of polymer cylinders comprising a second polymer material, the first polymer material being a different polymer material than the second polymer material.

12. The method of claim 8, wherein metalizing the plurality of polymer cylinders further comprises infiltrating a metal into the plurality of polymer cylinders.

13. The method of claim 8, wherein the plurality of polymer cylinders comprise a first polymer material that is surrounded by a second polymer material, and wherein metalizing the polymer cylinders further comprises removing the plurality of polymer cylinders forming a plurality of cylindrical openings, and filling the plurality of cylindrical openings with a metal.

14. A method of forming a device, the method comprising:
- forming a first stack of plurality of nano-lines over a substrate, the first stack of plurality of nano-lines comprising first nano-lines arranged in a first plane above the substrate and second nano-lines arranged in a second plane above the first plane; and
- forming a first set of polymer cylinders between the first nano-lines and the second nano-lines with a first directed self-assembly process.

15. The method of claim 14, wherein the first directed self-assembly process further comprises:
- filling a cavity between the first plane and the second plane with a first polymer mixture comprising a di-block copolymer;
- converting the first polymer mixture to form the first set of polymer cylinders; and
- metalizing the first set of polymer cylinders.

16. The method of claim 14, further comprising:
- forming a second stack of plurality of nano-lines over the first stack of plurality of nano-lines, the second stack of plurality of nano-lines comprising third nano-lines arranged in a third plane above the second plane and fourth nano-lines arranged in a fourth plane above the third plane; and
- forming a second set of polymer cylinders between the third nano-lines and the fourth nano-lines with a second directed self-assembly process.

17. The method of claim 16, wherein the second directed self-assembly process further comprises:
- filling a cavity between the third plane and the fourth plane with a second polymer mixture comprising a multi-block copolymer; and
- converting the second polymer mixture to form the second set of polymer cylinders; and
- metalizing the second set of polymer cylinders.

18. The method of claim 14, further comprising:
- forming a second stack of plurality of nano-lines over the first stack of plurality of nano-lines prior to forming the first set of polymer cylinders, the second stack of plurality of nano-lines comprising third nano-lines arranged in a third plane above the second plane and fourth nano-lines arranged in a fourth plane above the third plane;
- filling a first cavity between the first plane and the second plane and a second cavity between the third plane and the fourth plane with a polymer mixture comprising a multi-block copolymer;
- converting the polymer mixture to form the first set of polymer cylinders comprising a first polymer material between the first plane and the second plane and a second set of polymer cylinders comprising a second polymer material between the second plane and the third plane; and
- metalizing the first set of polymer cylinders and the second set of polymer cylinders.

19. The method of claim 18, wherein the first set of polymer cylinders is oriented orthogonal to the second set of polymer cylinders.

20. The method of claim 18, wherein the first set of polymer cylinders is attached to the second set of polymer cylinders at a plurality of locations.

* * * * *